United States Patent
Anazawa

(10) Patent No.: US 9,374,052 B1
(45) Date of Patent: Jun. 21, 2016

(54) VOICE COIL PROTECTION USING DAMPING

(71) Applicant: BLACKBERRY LIMITED, Waterloo (CA)

(72) Inventor: Isao Ginn Anazawa, Kitchener (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 0 days.

(21) Appl. No.: 14/555,642

(22) Filed: Nov. 27, 2014

(51) Int. Cl.
  *H03G 11/00* (2006.01)
  *H03G 1/00* (2006.01)
  *H04R 3/00* (2006.01)

(52) U.S. Cl.
  CPC ............. *H03G 1/0035* (2013.01); *H04R 3/007* (2013.01)

(58) Field of Classification Search
  None
  See application file for complete search history.

(56) References Cited

U.S. PATENT DOCUMENTS

| | | | | |
|---|---|---|---|---|
| 3,742,320 | A * | 6/1973 | Ban ............................. | 360/73.06 |
| 7,211,973 | B1 * | 5/2007 | Rana ......................... | 318/400.34 |
| 2004/0008848 | A1 | 1/2004 | Krochmal et al. | |
| 2005/0084120 | A1 * | 4/2005 | Hagino .......................... | 381/120 |
| 2006/0023896 | A1 * | 2/2006 | Ginsberg et al. ............. | 381/94.8 |
| 2006/0039267 | A1 | 2/2006 | Hanks | |
| 2007/0075781 | A1 * | 4/2007 | Yasuda et al. ................. | 330/296 |
| 2009/0046210 | A1 * | 2/2009 | Sakamoto et al. ............ | 348/738 |
| 2011/0126407 | A1 * | 6/2011 | Ryat ............................... | 29/825 |
| 2012/0105153 | A1 * | 5/2012 | Doi ............................... | 330/149 |
| 2015/0334477 | A1 * | 11/2015 | Macours et al. ......... | H04R 1/00 |

FOREIGN PATENT DOCUMENTS

| | | |
|---|---|---|
| EP | 0903961 A2 | 3/1999 |
| JP | 2005323026 A | 11/2005 |
| WO | WO-2014045123 A2 | 3/2014 |

OTHER PUBLICATIONS

Extended European Search Report dated Mar. 31, 2016 for European Patent Application No. 15194758.7.

* cited by examiner

*Primary Examiner* — Thang Tran
(74) *Attorney, Agent, or Firm* — Perry + Currier, Inc.

(57) ABSTRACT

A method, system and apparatus for voice coil protection using damping are provided. At a device and/or a system comprising: a processor; a sound transducer comprising a voice coil; a power supply; an amplifier in communication with the voice coil; and a circuit configured to apply an electromotive force ("EMF") to the voice coil under control of the processor, the amplifier is placed into a standby state. When the amplifier is in the standby state, the circuit is controlled to apply the EMF to the voice coil using the power supply so that the voice coil has restricted excursion.

19 Claims, 9 Drawing Sheets

VOICE COIL PROTECTION USING DAMPING

FIELD

The specification relates generally to sound transducers, and specifically to a method, system and apparatus for voice coil protection using damping.

BACKGROUND

Moving parts of a sound transducer, for example a loudspeaker and/or a receiver, include a membrane/voice-coil assembly which, in the case of a loudspeaker, is driven by an amplifier to produce sound based on an input signal and, in the case of a receiver has output voltage and/or current amplified by an amplifier. Excess amounts of voice coil and/or membrane excursion can be limited by a damping factor of the amplifier during operation, which generally has low impedance relative to the voice coil. While the amplifier is in a standby state and/or disabled state, the output impedance of the amplifier becomes high. This is problematic, and can become a serious concern, when the sound transducer is dropped on a hard floor and/or exposed to high acceleration of a force as, in this configuration, the membrane/voice-coil assembly is free to move. Hence, an excess amount of the voice coil excursion can result which, in a worst case scenario, results in the membrane/voice-coil assembly being damaged permanently.

BRIEF DESCRIPTIONS OF THE DRAWINGS

For a better understanding of the various implementations described herein and to show more clearly how they may be carried into effect, reference will now be made, by way of example only, to the accompanying drawings in which.

DETAILED DESCRIPTION

Figure 1:
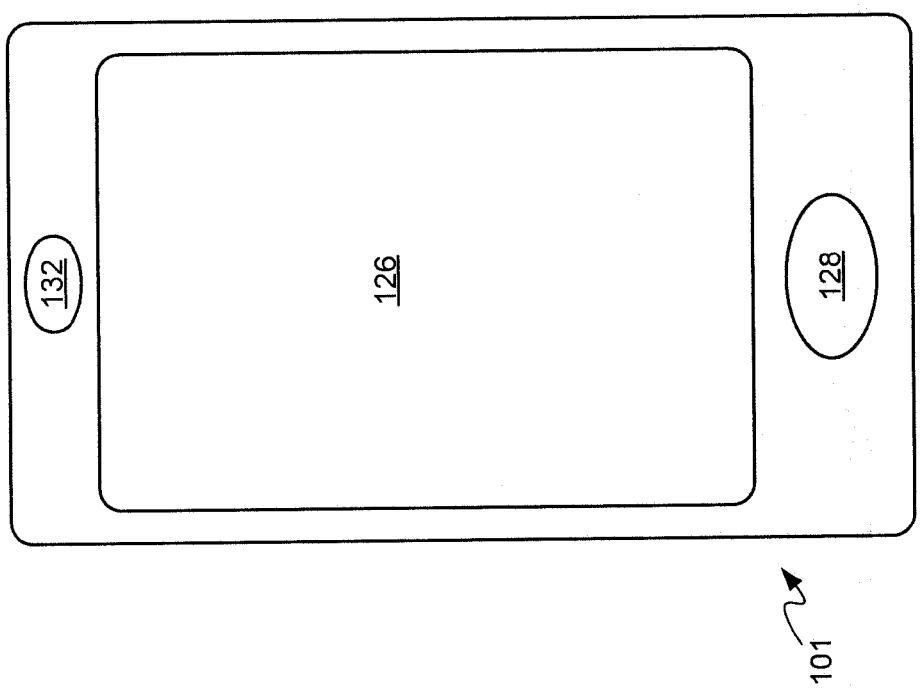
FIG. 1 depicts a device configured for voice coil protection using damping, according to non-limiting implementations.

In general, this disclosure is directed to a device that includes sound transducer and/or voice coil protection using damping. In particular, the device includes a circuit which applies an electromotive force to a voice coil of the sound transducer when an amplifier, that otherwise assists in operation of the voice coil, is placed in a standby mode, where components of the amplifier are placed in an off-state and/or low power state. The circuit can be implemented in various ways, however in each case the voice coil terminates in a resistance when the amplifier is in the standby mode, the resistance being in communication to a power supply of the device, the resistance being small enough so that an electromotive force is applied to the voice coil that prevents and/or minimizes excursion of the voice coil, and/or a membrane of the sound transducer. In one implementation, the circuit includes a portion of the amplifier, and in particular two transistors which can be controlled to apply the electromotive force by placing them in a closed state, with other transistors of the amplifier placed in an open state. In other implementations, the circuit and/or the two transistors can be separate from the amplifier. In yet further implementations, the device can include a sensor that can detect output of the voice coil and/or excursion of the device, and the electromotive force applied either according to the output and/or when excursion is detected, and when the amplifier is in the standby mode.

In this specification, the term "loudspeaker", "speaker" and "microspeaker" will be used interchangeably, and while present implementations are described with respect to loudspeakers at a mobile device, present implementations can be applied to any device in which loudspeaker excursion is to be limited to avoid damage. Specifically, it is appreciated that the terms "loudspeaker" "speaker" and "microspeaker" each refer to hardware which is used to provide sound at a device by using a voltage representing sound data to drive a voice coil at the loudspeaker. Furthermore, while the present specification refers to a voice coil at a loudspeaker, it is appreciated that the term voice coil is used interchangeably with the term speaker coil, and that a voice coil is used to convert voltages to sound, including, but not limited to sound from voice data, music data, video data, and the like. In other words, while voice coils described herein can be used to produce sound that corresponds to the voice of a human, and the like, voice coils described herein are not to be limited to such implementations.

Reference may also be made herein to the term "program material" which can comprises sound data used to drive a loudspeaker including, but not limited to, voice data, music data, video data, and the like. In other words, "program material" as used herein can refer to sound data and/or sound files which can be processed to produce an input signal to a loudspeaker. In some instances, the term "program material", however, will be used colloquially and interchangeably with the terms input signal and output signal, signifying that the program material is used to produce an input signal to a loudspeaker and/or an output signal that drives the loudspeaker, the output signal comprising a filtered version of the input signal.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

An aspect of the specification provides a device comprising: a processor; a sound transducer comprising a voice coil; a power supply; an amplifier in communication with the voice coil; and a circuit configured to apply an electromotive force ("EMF") to the voice coil under control of the processor; the processor configured to: place the amplifier into a standby state; and, when the amplifier is in the standby state, control the circuit to apply the EMF to the voice coil using the power supply so that the voice coil has restricted excursion.

The circuit can comprise a portion of the amplifier.

The circuit can comprise electrical components configured to apply the EMF to the voice coil in the standby state.

The circuit can comprise a resistance such that the voice coil is terminated in the resistance, which is in turn in communication with the power supply, when the amplifier is in the standby state, the voice coil being otherwise controlled by the amplifier.

The circuit can comprise two transistors in series with the voice coil and a connection to the power supply located between the two transistors, the processor can be further configured to turn the two transistors on when the amplifier is in the standby state. The amplifier can comprise the two transistors, the two transistors used to drive the voice coil to emit sound when the amplifier is not in the standby state.

The device can further comprise a sensor and one or more switches configured to connect the voice coil with the sensor when the one or more switches are closed, the sensor configured to detect an output from the voice coil, the processor can be further configured to: close the one or more switches when the amplifier is in the standby state, and otherwise open the one or more switches; and, when the amplifier is in the standby state, and when the output of the voice coil, as detected by the sensor, is above a threshold value, control the circuit to apply the EMF to the voice coil using the power supply. The sensor can comprise a diode.

The device can further comprise a sensor configured to detect an output EMF from the voice coil, the circuit further configured to apply the EMF to the voice coil, the EMF being about similar to the output EMF but in an opposite direction.

The device can further comprise an accelerometer, the processor can be further configured to, when the amplifier is in the standby state, and when output from the accelerometer is above a threshold value, control the circuit to apply the EMF to the voice coil.

The sound transducer can comprise a loudspeaker.

The sound transducer can comprise one or more of a receiver and a microphone.

The processor can be further configured to place the amplifier in the standby state by turning off components of the amplifier other than those related to the circuit.

Another aspect of the specification provides a method comprising: placing, using a processor of a device, an amplifier of the device into a standby state, the device comprising: the processor; a sound transducer comprising a voice coil; a power supply; the amplifier in communication with the voice coil; and a circuit configured to apply an electromotive force ("EMF") to the voice coil under control of the processor; and, when the amplifier is in the standby state, controlling, using the processor, the circuit to apply the EMF to the voice coil using the power supply so that the voice coil has restricted excursion.

The device further can comprise a sensor and one or more switches configured to connect the voice coil with the sensor when the one or more switches are closed, the sensor configured to detect an output from the voice coil, and the method can further comprise: closing, using the processor, the one or more switches when the amplifier is in the standby state, and otherwise opening, using the processor, the one or more switches; and, when the amplifier is in the standby state, and when the output of the voice coil, as detected by the sensor, is above a threshold value, control the circuit to apply the EMF to the voice coil using the power supply.

The device further can comprise a sensor configured to detect an output EMF from the voice coil, and the method can further comprise applying, using the circuit, the EMF to the voice coil, the EMF being about similar to the output EMF but in an opposite direction.

The device further can comprise an accelerometer, and the method can further comprise, when the amplifier is in the standby state, and when output from the accelerometer is above a threshold value, controlling, using the processor, the circuit to apply the EMF to the voice coil.

The method can further comprise, placing, using the processor, the amplifier in the standby state by turning off components of the amplifier other than those related to the circuit.

Yet a further aspect of the specification provides a computer program product, comprising a computer usable medium having a computer readable program code adapted to be executed to implement a method comprising: placing, using a processor of a device, an amplifier of the device into a standby state, the device comprising: the processor; a sound transducer comprising a voice coil; a power supply; the amplifier in communication with the voice coil; and a circuit configured to apply an electromotive force ("EMF") to the voice coil under control of the processor; and, when the amplifier is in the standby state, controlling, using the processor, the circuit to apply the EMF to the voice coil using the power supply so that the voice coil has restricted excursion. The computer usable medium can comprise a non-transitory computer usable medium.

Figure 2:
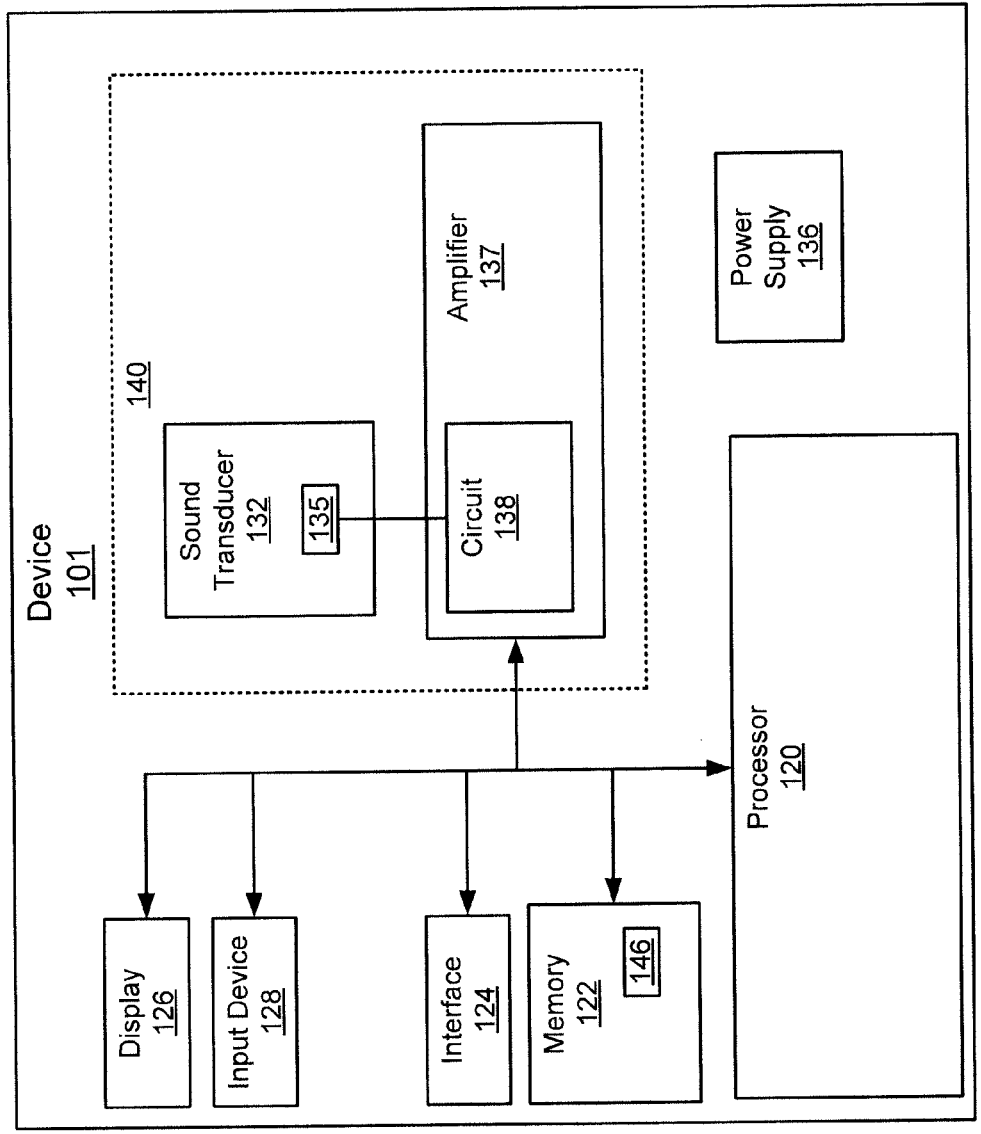
FIG. 2 depicts a schematic block diagram of the device of FIG. 1, according to non-limiting implementations.

Attention is next directed to FIG. 1 and FIG. 2 which respectively depict a front perspective view and a schematic diagram of a mobile electronic device 101, referred to interchangeably hereafter as device 101, according to non-limiting implementations. Device 101 is generally configured for loudspeaker and receiver transducer protection using damping, as will be explained in detail hereafter. Device 101 comprises: a processor 120; a sound transducer 132 comprising a voice coil 135; a power supply 136; an amplifier 137 in communication with voice coil 135; and a circuit 138 configured to apply an electromotive force ("EMF") to voice coil 135 under control of processor 120; processor 120 configured to: place amplifier 137 into a standby state; and, when amplifier 137 is in the standby state, control circuit 138 to apply the EMF to voice coil 135 using power supply 136 so that voice coil 135 has restricted excursion. While optional, device 101 further comprises a communication interface 124 (interchangeably referred to hereafter as interface 124) and an input device 128. Furthermore, sound transducer 132 can comprise a loudspeaker or a microphone.

Device 101 can be any type of electronic device that can be used in a self-contained manner to communicate with one or more communication networks. Device 101 can include, but is not limited to, any suitable combination of electronic devices, communications devices, computing devices, personal computers, laptop computers, portable electronic devices, mobile computing devices, portable computing devices, tablet computing devices, laptop computing devices, desktop phones, telephones, PDAs (personal digital assistants), cellphones, smartphones, e-readers, internet-enabled appliances and the like. Other suitable devices are within the scope of present implementations. For example, device 101 need not comprise a mobile communication device, but rather can comprise a loudspeaker system and/or a receiver system with associated specialized functions, and being connectable to stereo systems, recording systems, and the like.

It should be emphasized that the shape and structure of device 101 in FIGS. 1 and 2 are purely examples, and contemplate a device that can be used for both wireless voice (e.g. telephony) and wireless data communications (e.g. email, web browsing, text, and the like). However, FIG. 1 contemplates a device that can be used for any suitable specialized functions, including, but not limited, to one or more of, telephony, computing, appliance, and/or entertainment related functions. In other words, in other implementations, device 101 can comprise any device that comprises one or more loudspeakers that converts sound data to sound, including, but not limited to, a television, a stereo system, an entertainment device, and the like.

With reference to FIGS. 1 and 2, device 101 comprises at least one input device 128 generally configured to receive input data, and can comprise any suitable combination of input devices, including but not limited to a keyboard, a keypad, a pointing device (as depicted in FIG. 1), a mouse, a track wheel, a trackball, a touchpad, a touch screen and the like. Other suitable input devices are within the scope of present implementations.

Input from input device 128 is received at processor 120 (f which can be implemented as a plurality of processors, and/or as one or more DSPs including but not limited to one or more central processors (CPUs)). Processor 120 is configured to communicate with a memory 122 comprising a non-volatile storage unit (e.g. Erasable Electronic Programmable Read Only Memory ("EEPROM"), Flash Memory) and a volatile storage unit (e.g. random access memory ("RAM")). Programming instructions that implement the functional teachings of device 101 as described herein are typically maintained, persistently, in memory 122 and used by processor 120 which makes appropriate utilization of volatile storage during the execution of such programming instructions. Those skilled in the art will now recognize that memory 122 is an example of computer readable media that can store programming instructions executable on processor 120. Furthermore, memory 122 is also an example of a memory unit and/or memory module.

Memory 122 further stores an application 146 that, when processed by processor 120, enables processor 120 to: place amplifier 137 into a standby state; and, when amplifier 137 is in the standby state, control circuit 138 to apply the EMF to voice coil 135 using power supply 136 so that voice coil 135 has restricted excursion.

Furthermore, memory 122 storing application 146 is an example of a computer program product, comprising a non-transitory computer usable medium having a computer readable program code adapted to be executed to implement a method, for example a method stored in application 146.

Processor 120 can be further configured to communicate with display 126, which comprises any suitable one of, or combination of, flat panel displays (e.g. LCD (liquid crystal display), plasma displays, OLED (organic light emitting diode) displays, capacitive or resistive touchscreens, CRTs (cathode ray tubes) and the like.

Processor 120 also connects to communication interface 124 (interchangeably referred to interchangeably as interface 124), which can be implemented as one or more radios and/or connectors and/or network adaptors, configured to wirelessly communicate with one or more communication networks (not depicted). It will be appreciated that interface 124 is configured to correspond with network architecture that is used to implement one or more communication links to the one or more communication networks, including but not limited to any suitable combination of USB (universal serial bus) cables, serial cables, wireless links, cell-phone links, cellular network links (including but not limited to 2G, 2.5G, 3G, 4G+ such as UMTS (Universal Mobile Telecommunications System), GSM (Global System for Mobile Communications), CDMA (Code division multiple access), FDD (frequency division duplexing), LTE (Long Term Evolution), TDD (time division duplexing), TDD-LTE (TDD-Long Term Evolution), TD-SCDMA (Time Division Synchronous Code Division Multiple Access) and the like, wireless data, Bluetooth links, NFC (near field communication) links, WLAN (wireless local area network) links, WiFi links, WiMax links, packet based links, the Internet, analog networks, the PSTN (public switched telephone network), access points, and the like, and/or a combination.

Power supply 136 can comprise, a battery, a power pack and the like; however, in other implementations, power supply 136 can comprise a connection to a mains power supply and/or a power adaptor (e.g. and AC-to-DC (alternating current to direct current) adaptor). Furthermore, power supply 136 powers components of device 101 including, but not limited to processor 120, amplifier 137, circuit 138, sound transducer 132, voice coil 135 and the like.

Sound transducer 132, and voice coil 135, can comprise any sound transducer system configured to either emit sound under control of amplifier 137 (when sound transducer 132 comprises a loudspeaker) or amplify voltage and/or current output by voice coil 135 corresponding to sound collected by sound transducer 132 (when sound transducer 132 comprises a receiver and/or a microphone). Either way, amplifier 137 is controlled by processor 120, as depicted. While not depicted, sound transducer 132 further comprises a membrane in communication with voice coil 135; when sound transducer 132 comprises a loudspeaker, voice coil 135 moves the membrane, under control of amplifier 137, resulting in sound emitted from sound transducer 132, and when sound transducer 132 comprises a received and/or a microphone, voice coil 135 is moved by the membrane, and amplifier 137 receives and amplifies output of voice coil 135.

In implementations where sound transducer 132 comprises a loudspeaker, device 101 can further comprise a microphone and, in implementations where sound transducer 132 comprises a microphone, device 101 can further comprise a loudspeaker. Indeed, each loudspeaker and each microphone can be provided with a corresponding amplifier and circuit equivalent to amplifier 137 and circuit 138.

Processor 120 is generally configured to place amplifier 137 into a standby state where amplifier 137 is generally disabled so that: a. amplifier 137 does not consume power and/or power consumption by amplifier 137 is minimized; and b. sound transducer 132 does not operate to either emit or collect sound. In general, processor 120 can place amplifier 137 into the standby state when device 101 enters a standby state and/or a disabled state and/or a hibernation state, where power consumption across a substantial portion and/or all components of device 101 is minimized. For example, the standby state can be entered after a period of inactivity at device 101 and/or when device 101 enters a disabled state and/or hibernation state; indeed, the standby state can include, but is not limited to, a disabled state and/or a hibernation state.

However, according to present implementations described in further detail below, processor 120 generally controls circuit 138 to restrict excursion of voice coil 135 using an EMF when amplifier 137 enters the standby state. In other words, in present implementations, in a standby state, EMF is used to restrict excursion of voice coil 135 rather than voice coil 135 being generally free to move, and hence in danger of being damaged when device 101 is dropped and/or subjected to acceleration forces and the like.

As depicted, circuit 138 can comprise a portion of amplifier 137 however, in other implementations, circuit 138 can be separate from amplifier 137. Indeed, in general, circuit 138 comprises electrical components configured to apply the EMF to voice coil 135 in the standby state. As will be described in further detail below, when amplifier 137 is in the standby state, circuit 138 generally comprises a resistance such that voice coil 135 is terminated in the resistance, which is in turn in communication with power supply 136, voice coil 135 being otherwise controlled by amplifier 137.

In some implementations, device 101 and/or circuit 138, further comprises a sensor configured to detect an output from voice coil 135, the output being used to control the EMF. In other implementations, device 101 and/or circuit 138, further comprises a sensor, including, but not limited to an accelerometer, configured to detect movement of device 101 and, when output from the sensor and/or the accelerometer is above a threshold value, processor 120 control circuit 138 to apply the EMF to voice coil 135. In other words, the threshold value can be associate with a given acceleration and/or a given movement of device 101 above which damage can be incurred at sound transducer 132 when a sudden stop and/or a sudden change in velocity and/or a sudden change in direction of device 101 occurs, voice coil 135 being restricted in excursion.

In any event, it should be understood that a wide variety of configurations for device 101 are contemplated. In particular, in FIG. 2, a combination 140 of sound transducer 132, voice coil 135, amplifier 137 and circuit 138 is indicated, and a various implementations of such will be described in further detail below.

Figure 3:
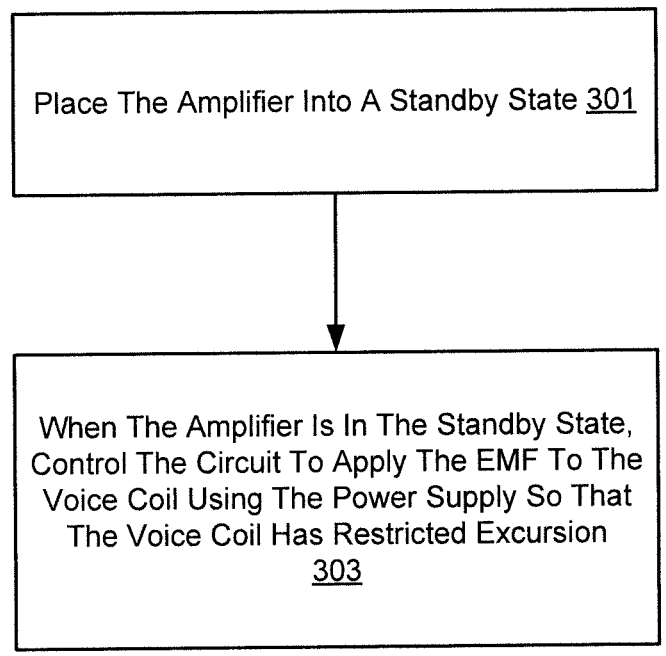
FIG. 3 depicts a method of voice coil protection using damping, according to non-limiting implementations.

Attention is now directed to FIG. 3 which depicts a flowchart of a method 300 for sound transducer and/or voice coil protection using damping, according to non-limiting implementations. In order to assist in the explanation of method 300, it will be assumed that method 300 is performed using device 101, and specifically by processor 120 of device 101, for example when processor 120 processes application 146. Indeed, method 300 is one way in which device 101 can be configured. Furthermore, the following discussion of method 300 will lead to a further understanding of device 101, and its various components. However, it is to be understood that device 101 and/or method 300 can be varied, and need not work exactly as discussed herein in conjunction with each other, and that such variations are within the scope of present implementations.

Regardless, it is to be emphasized, that method 300 need not be performed in the exact sequence as shown, unless otherwise indicated; and likewise various blocks may be performed in parallel rather than in sequence; hence the elements of method 300 are referred to herein as "blocks" rather than "steps". It is also to be understood, however, that method 300 can be implemented on variations of system 100 as well.

At block 301, processor 120 places amplifier 137 into a standby state. For example, processor 120 can place amplifier 137 in the standby state by turning off components of amplifier 137 other than those related to circuit 138, as described in further detail below.

At block 303, when amplifier 137 is in the standby state, processor 120 controls circuit 138 to apply an electromotive force to voice coil 135 using power supply 136 so that voice coil 135 has restricted excursion.

When device 101 comprises a sensor configured to detect an output EMF from voice coil 135, block 303 can include processor 120 controlling circuit 138 to an EMF to voice coil 135 that is about similar to the output EMF but in an opposite direction. In other words, active damping of voice coil 135 occurs.

When device 101 and/or circuit 138 further comprises an accelerometer in communication with processor 120, method 300 can include processor 120 controlling circuit 138 to apply the EMF to voice coil 135 when amplifier 137 is in the standby state, and when output from the accelerometer is above a threshold value. In other words, both conditions are satisfied so that controlling of circuit 138 to apply the EMF to voice coil 135 occurs.

Various implementations of a combination 140 of sound transducer 132, voice coil 135, amplifier 137 and circuit 138 are described below with reference to FIGS. 4 to 9.

Figure 4:
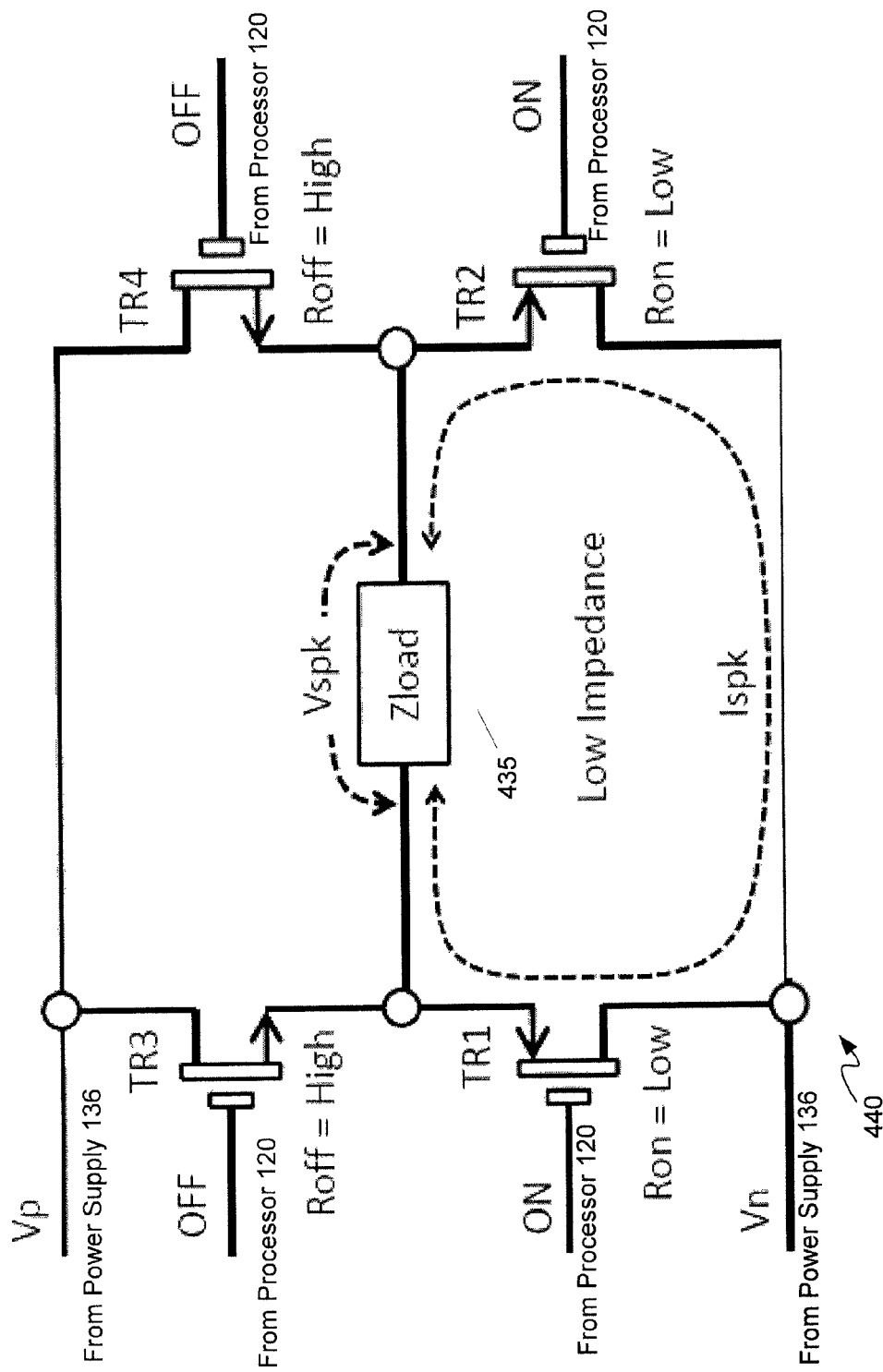
FIG. 4 depicts details of components of the device of FIG. 1 for voice coil protection using damping, according to non-limiting implementations.

For example, attention is next directed to FIG. 4, which depicts components 440 of combination 140, according to non-limiting implementations. In other words, combination 140 can include components 440, however combination 140 can include other components not depicted in FIG. 2.

Components 440 comprise: a load 435 which is representative of voice coil 135, and is also labelled "Zload"; connections Vp, Vn to power supply 136, with Vp comprising a connection to a positive terminal of power supply 136, and Vn comprising a connection to a negative terminal of power supply 136; and transistors TR1, TR2, TR3, TR4 arranged in a Wheatstone bridge configuration with load 435, with connection Vn located between transistors TR1, TR2, and connection Vp located between transistors TR3, TR4. In particular, transistors TR1, TR2, TR3, TR4 can be components of amplifier 137, with either of pair of transistors TR1, TR2 or pair of transistors TR3, TR4 being components of circuit 138.

While not depicted in FIG. 4, it is assumed that processor 120 is in communication with each of transistors TR1, TR2, TR3, TR4 and that processor 120 can turn each of transistors TR1, TR2, TR3, TR4 on or off. As depicted, processor 120 has controlled transistors TR1, TR2 to an on-state, and transistors TR3, TR4 to an off-state. As such, a resistance Ron of each of transistors TR1, TR2, is "low" compared to a resistance Roff of each of transistors TR3, TR4. In other words, resistance Roff of each of transistors TR3, TR4 is generally very large and/or infinite and/or equal to an open and/or off transistor resistance, and resistance Ron of each of transistors TR1, TR2 is generally very small as compared to Roff and/or equal to a closed and/or on transistor resistance. Furthermore, Ron of each of transistors TR1, TR2 is about the same.

As such, a circuit represented by load 435, transistor TR1, connection Vn, transistor TR2, arranged in series, results in a net EMF on load 435; specifically, an initial current Ispk flows in this circuit to apply the EMF to load 435, represented by a voltage Vspk across load 435. As load 435 represents voice coil 135, when transistors TR1, TR2 are placed in the on-state, while transistors TR3, TR4 are placed in the off-state, the net result is that the EMF applied to load 435 restricts excursion of voice coil 135. Hence, processor 120 when amplifier 137 is in the standby state, processor 120 places transistors TR1, TR2 in the on-state, while transistors TR3, TR4 are placed in the off-state, in order to apply the EMF to voice coil 135. In other words, a termination resistance of twice Ron assists with electromagnetic induction induced current, Ispk, which produces the EMF that in turn restricts movement of voice coil 135.

Hence, in these implementations circuit 138 comprises transistor TR1, connection Vn, transistor TR2, arranged in series with load 435, and circuit 138 comprises a resistance equivalent to twice resistance Ron, such that voice coil 135 is terminated in a resistance of twice Ron, which is in turn in communication with power supply 136, when amplifier 137 is in the standby state, voice coil 135 being otherwise controlled by the amplifier. In other words, when amplifier 137 is not in the standby state, each of transistors TR1, TR2, TR3, TR4 of amplifier 137 are used to control voice coil 135 in accordance with program material so that sound is emitted from sound transducer 132.

In particular, in implementations depicted in FIG. 4, circuit 138 comprises two transistors TR1, TR2 in series with voice coil 135 and a connection Vn to power supply 136 located between the two transistors TR1, TR2, processor 120 configured to turn the two transistors TR1, TR2 on when amplifier 137 is in the standby state. In particular, amplifier 137 can comprise the two transistors TR1, TR2, the two transistors TR1, TR2 used to drive voice coil 135 to emit sound when amplifier 137 is not in the standby state.

However, in other implementations, transistors TR3, TR4 could be used to apply the EMF to load 435 and/or voice coil 135 by processor 120 placing transistors TR3, TR4 into an on-state and placing transistors TR1, TR2 into an off-state.

In yet further implementations, circuit 138 could be in addition to amplifier 137 so that the behaviour of amplifier 137 need not be modified in the standby state. In other words, a circuit comprising two additional transistors in series with voice coil 135 and a connection Vn to power supply 136 located between the two additional transistors could be added to components 440 so that transistors TR1, TR2, TR3, TR4 are always in the off-state in the standby state, with the two additional transistors being in the on-state when amplifier 137 is in the standby state, the two additional transistors being otherwise in an off-state.

Figure 5:
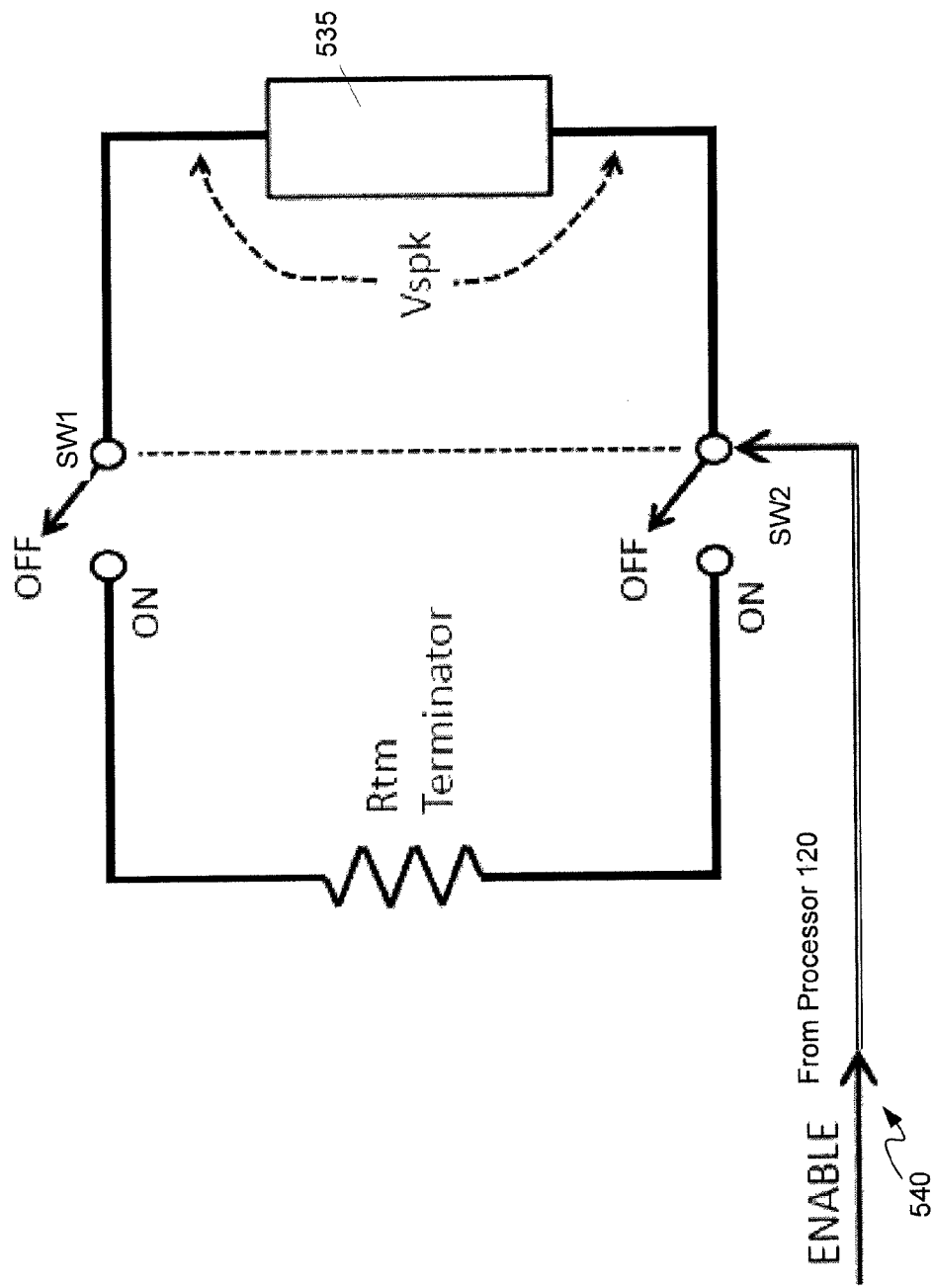
FIG. 5 depicts an equivalent circuit of the components of FIG. 4, according to non-limiting implementations.

Attention is next directed to FIG. 5, which depicts a circuit 540 which comprises a modelled equivalent to a circuit represented by load 435, transistor TR1, connection Vn, transistor TR2, arranged in series of FIG. 4. In particular, circuit 540 comprises a switch SW1, a resistance Rtm (i.e. a Terminator resistance), a switch SW2, and a load 535 corresponding to voice coil 135 arranged in series. While not depicted, it is assumed that circuit 540 comprises a connection to power supply 136. Switches SW1, SW2 and resistance Rtm are the equivalent of transistors TR1, TR2 and resistances Ron of FIG. 4; hence, when each of switches SW1, SW2 are closed (i.e. each of transistors TR1, TR2 are in an on-state), a voltage VSpk occurs across load 535 and an EMF is applied to voice coil 135.

Put another way, in present implementations, a sound transducer (e.g. loudspeaker or receiver) amplifier output driver is placed in a standby state so that no current flows loudspeaker from a DC power supply, but rather the sound transducer is terminated with a small resistance and/or inductance while in standby state (which can also be referred to as a disabled state). This termination by small resistance produced the path for and electromagnetic induction induced current which in turn produces an EMF that in turn restricts excursion of the sound transducer voice coil and/or membrane. This "Protection" mode can be achieved by activating both transistors TR1, TR1 of FIG. 4, but deactivating both transistors TR3, TR4. Membrane/Voice-coil induced current can be fed back to the sound transducer through transistors TR1, TR1 with very small resistance to cause a force (by back-emf) that restricts the excursion and/or movement.

In reverse, activating both TR1 and TR2, and deactivating both TR3 and TR4 will equally achieve same effects as above.

Figure 6:
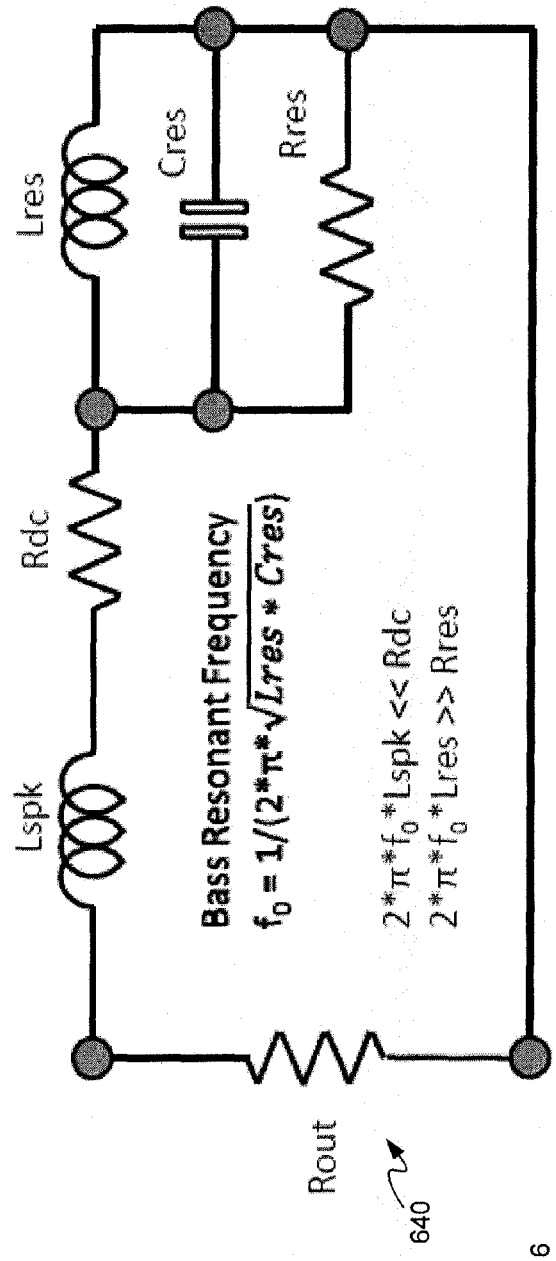
FIG. 6 depicts another equivalent circuit of the components of FIG. 4, as well as equations for modelling the another equivalent circuit, according to non-limiting implementations.

Attention is next directed to FIG. 6, which depicts a circuit 640 which comprises another modelled equivalent to a circuit represented by load 435, transistor TR1, connection Vn, transistor TR2, arranged in series of FIG. 4. In particular, it is assumed in FIG. 6 that each of transistors TR1, TR2 are in the on-state, hence no switches are depicted. However, circuit 640 comprises an equivalent inductance Lspk and an equivalent resistance Rdc of voice coil 135, as well as an equivalent inductance Lres, an equivalent capacitance Cres and an equivalent resistance Rres of the pair of resistors TR1, TR2 in the on-state, as well as a resistance Rout that corresponds to an amplifier's output impedance and/or a shunted resistance of the combination of TR1 and TR2 (i.e. the total Ron in FIG. 4) (or alternatively the combination of TR3 and TR3) when they are in a protection mode (i.e. the combination of TR1 and TR2 are "ON" as in FIG. 4). A resistance Rout that results in critical and/or smooth damping of voice coil 135 can be calculated with equations that are also depicted in FIG. 6 using a value of "Q" critical damping Q normally selected in the range of 0.5 to 1.

Specifically, FIG. 6 also depicts equations that describe modelling of a frequency behaviour of circuit 640 that include definitions of a relative values of resistance Rdc with respect to inductance Lspk, as well as relative values of resistance Rres with respect to inductance Lres, each at a and a definition of a resonance frequency of circuit 640 as follows:

$$Q = \overline{\omega o} * Cres * Rres * (Rout+Rdc)/(Rout+Rdc+Rres) \quad \text{Equation (1)}$$

$$Q = 0.5 \quad \text{Equation (2)}$$

$$Rout = \frac{(Rres + Rdc - 2 * \overline{\omega o} * Cres * Rres * Rout * Rdc)}{(2 * \overline{\omega o} * Cres * Rres - 1)} \quad \text{Equation (3)}$$

$$2\pi fo Lspk << Rdc \quad \text{Equation (4)}$$

$$2\pi fo Lres << Rres \quad \text{Equation (5)}$$

$$fo = 1/(2*\pi*\sqrt{Lres*Cres}) \quad \text{Equation (6)}$$

In Equations (4), (5) and (6), $\overline{\omega o}$ comprises angular velocity, and fo comprises a loudspeaker's (acoustical) resonance frequency, for example in the range of a few hundred Hertz. Furthermore, Q can be set to about 0.5, and the equations solved for Rout.

In any event, successful prototypes of device 101 using components similar to components depicted in FIG. 4 were produced and tested, with termination resistances of infinity and/or open, 5Ω and 0.47Ω used to test a prototype that includes a sound transducer comprising a loudspeaker, and with termination resistances of infinity and/or open, 31.6Ω and 0.47Ω used to test a prototype that includes a sound transducer comprising a receiver and/or microphone. In the test, a voice coil of each prototype was terminated using one of the three respective resistances so that excursion was restricted in a mimic of the standby mode, and then each prototype was dropped onto a "hard" floor from a height of about 10 cm, but with an accelerating force applied to mimic a free fall drop from a larger height, on each of the prototype's back, front and side. The resulting output voltage of the voice coil was measured at the point of impact, with the results for the loudspeaker implementation shown in Table 1, and the results for the receiver implementation shown in Table 2. The damping ratios for the 0.47Ω implementation, as compared to each of the open and 5Ω implementations are also provided.

TABLE 1

RESULTS OF LOUDSPEAKER PROTOTYPE

| | TERMINATION RESISTANCE | | | DAMPING RATIO | |
|---|---|---|---|---|---|
| MODE | OPEN | 5Ω | 0.47Ω | 0.47Ω/OPEN | 0.47Ω/5Ω |
| Back | 18.6 V | 6.14 V | 1.08 V | 0.06 | 0.18 |
| Front | 18.7 V | 6.31 V | 1.00 V | 0.05 | 0.16 |
| Side | 3.74 V | 1.30 V | 0.25 V | 0.07 | 0.19 |

TABLE 2

RESULTS OF RECEIVER PROTOTYPE

| | TERMINATION RESISTANCE | | | DAMPING RATIO | |
|---|---|---|---|---|---|
| | | | | 0.47Ω/ | 0.47Ω/ |
| MODE | OPEN | 31.6Ω | 0.47Ω | OPEN | 31.6Ω |
| Back | 17.9 V | 10.62 V | 0.37 V | 0.02 | 0.03 |
| Front | 16.6 V | 8.19 V | 0.50 V | 0.03 | 0.06 |
| Side | 7.68 V | 2.66 V | 0.22 V | 0.03 | 0.08 |

In each case, the damping, when the termination resistance (e.g. 0.47Ω) is small as compared to the open state is large as compared to damping in the open state. In other words, the measured voltage is representative of the excursion of the voice coil at the point of impact, and the smaller the voltage in Tables 1, 2, the smaller the excursion of the voice coil. Hence, for the 0.47Ω termination resistance, the excursion of the voice coil was restricted as compared to the other terminations. In particular, the voice coil voltage is reduced to between about 2% to about 7% when terminated in 0.47Ω as compared to the unterminated and/or open state. In general 0.47Ω is similar to the on-state resistances of two transistors, however other termination resistances are within the scope of present implementations. For example, Equations (1) to (6) can be solved for Rout, using a given Q value (e.g. 0.5), and the resulting Rout used to select the termination resistance.

Figure 7:
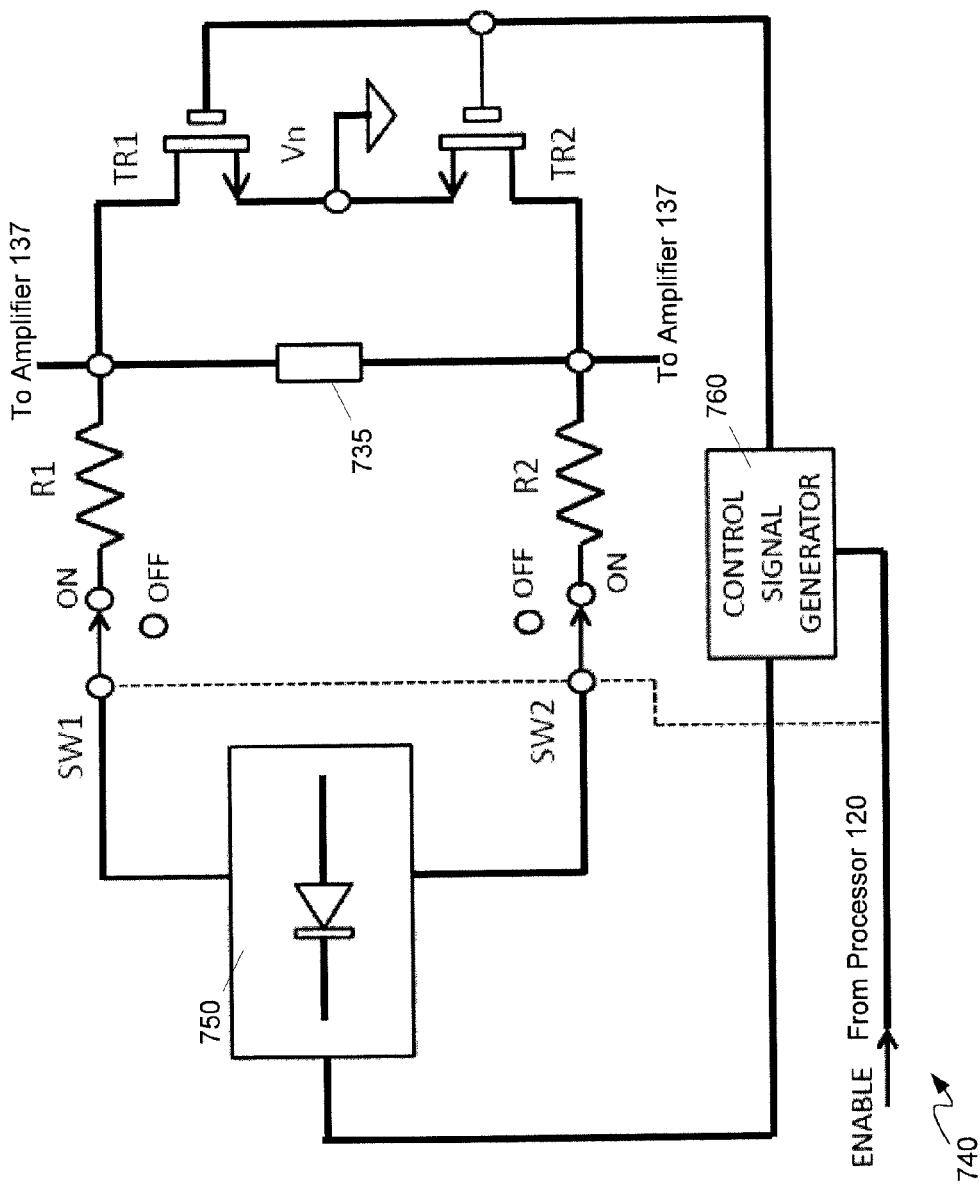
FIG. 7 depicts details of components of the device of FIG. 1 for voice coil protection using damping, according to alterative non-limiting implementations.

Attention is next directed to FIG. 7 which depicts components 740 of combination 140, according to alternative non-limiting implementations. In other words, combination 140 can include components 740, however combination 140 can include other components not depicted in FIG. 7.

Components 740 comprise: a load 735 which is representative of voice coil 135; a connections Vn to power supply 136, similar to connection Vn of FIG. 2; transistors TR1, TR2, similar to transistors TR1, TR2 of FIG. 2, and arranged in a similar manner; a control signal generator 760, which can receive an ENABLE signal from, for example, processor 120 (and/or processor 120 can comprise control signal generator 760) and is otherwise in communication with transistors TR1, TR2; and switches SW1, SW2, resistances R1, R2 and a sensor 750 arranged in series with load 735. Switches SW1, SW2 can be placed in an open state when amplifier 137 is not in the standby mode and placed in a closed state, as depicted, when amplifiers 137 is in the standby mode, switches SW1, SW2 being controlled by processor 120 (e.g. using the ENABLE signal shown in FIG. 7). While two switches SW1 SW2 and two resistors R1, R2 are depicted, in other implementations components 740 can include as few as one switch and one resistor. In general, resistors R1, R2 are present to control a magnitude of an output signal from load 735 to sensor 750. Transistors TR1, TR2 can be components of amplifier 137, or transistors TR1, TR2 can comprise components separate from amplifier 137. In general, circuit 138 comprises components 740 other than load 735.

An output of sensor 750 is generally in communication with control signal generator 760, and control signal generator 760 (and/or processor 120) is generally configured to control transistors TR1, TR2 using the output from sensor 750. For example, when the output from sensor 750 is above a threshold value associated with excessive movement of voice coil 135, then control signal generator 760 can control transistors TR1, TR2 to be in an on-state, as in FIG. 2. Alternatively, control signal generator 760 (and/or processor 120) can control transistors TR1, TR2 to be in an on-state whenever there is an output from sensor 750; for example, as depicted sensor 750 comprises a diode, and the diode will only generate an output when a signal from load 735 is above the threshold for the diode.

Hence, in implementations depicted in FIG. 7, device 101 further comprises sensor 750 and one or more switches SW1, SW2 configured to connect voice coil 135 (i.e. load 735) with sensor 750 when the one or more switches SW1, SW2 are closed, sensor 750 configured to detect an output from voice coil 135 (i.e. load 735), processor 120 and/or control signal generator 760 further configured to: close one or more switches SW1, SW2 when amplifier 137 is in the standby state, and otherwise open one or more switches SW1, SW2; and when amplifier 137 is in the standby state, and when the output of voice coil 135, as detected by sensor 750, is above a threshold value, control circuit 138 (e.g. at least transistors TR1, TR2) to apply an EMF to voice coil 135 (e.g. load 735) using power supply 136 (e.g. connection Vn).

Put another way, transducer induced output can be large enough to produce a power needed to drive sensor 750 and associated circuitry. In the standby state, two switches SW1 and SW2 are in On-state. An event of sudden acceleration, load 735 (i.e. a transducer and/or a voice coil) produces large enough output that is fed to a rectification circuit. Transistors TR1, TR2 can act as part of loudspeaker amplifier's output driver when the amplifier is in active state.

In particular, components 740 are arranged in a passive damping configuration. However, active damping of voice coil 135 is also within the scope of present implementations.

Figure 8:
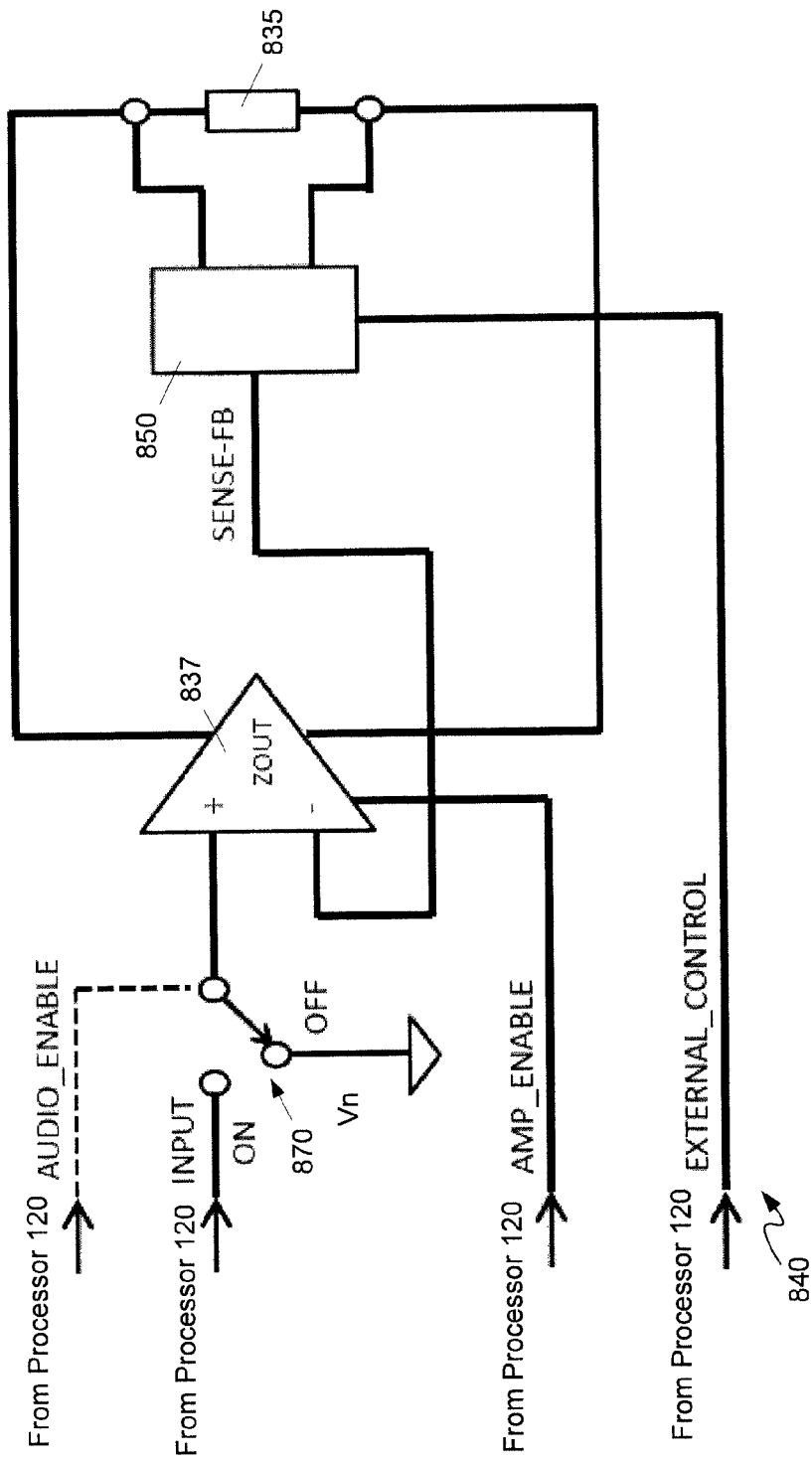
FIG. 8 depicts details of components of the device of FIG. 1 for voice coil protection using damping, according to other alterative non-limiting implementations.

For example, attention is next directed to FIG. 8, which depicts components 840 of combination 140, according to alternative non-limiting implementations. In other words, combination 140 can include components 840, however combination 140 can include other components not depicted in FIG. 8.

Components 840 comprise: a load 835 which is representative of voice coil 135; an amplifier 837, similar to amplifier 137 and while not depicted, amplifier 837 can comprises a plurality of transistors and power supply connections similar to those depicted in FIG. 4; and a sensor 850 connected across load 835. While all connections from amplifier 837 to load 835 are not depicted, it is appreciated that connections from amplifier 837 to load 835 are similar to those depicted in FIG. 4, presuming amplifier 837 comprises transistors similar to those depicted in FIG. 4. Further, sensor 850 can be similar to sensor 750, however sensor 850 can further comprise switches similar to switches SW1, SW2 in FIG. 7 (as well as resistors, also similar to FIG. 7), so that sensor 850 can be connected and disconnected from load 835 depending on a state of amplifier 837. For example, sensor 850 can be in communication with processor 120 so that an "ENABLE CONTROL" signal can be received from processor 120, which causes associated switches to close to connect sensor 850 to load 835 or alternatively causes associated switches to open to disconnect sensor 850 from load 835. In general, sensor 850 is across load 850 when amplifier 837 is placed into a standby state and disconnected otherwise.

Furthermore, amplifier 837 can be enabled or disabled via an input that receives an "AMP_ENABLE" signal from processor 120, though, in present implementations, as amplifier 837 is used to apply the EMF to load 835 (i.e. voice coil 135) in the standby state, amplifier 837 is enabled in the standby state.

Components 840 further comprise a switch 870 that can be switched between a connection Vn to power supply 136 and an audio input ("INPUT ON", e.g. from processor 120 and/or another source of program material), switch 870 being in communication with, and being controlled by, processor 120 such that upon receipt of an "AUDIO_ENABLE" signal from processor 120, switch 870 is switched between connection Vn and the audio input depending on whether amplifier 837 is being placed in a standby state (with no audio input, and connected to connection Vn) or not in a standby state (i.e. connected to audio input).

In other words, processor 120 can place amplifier 837 into the standby state by controlling switch 870 to switch from the audio input to connection Vn, and, in conjunction connect sensor 850 to load 835.

Sensor 850 is generally configured to detect an output EMF from load 835 (i.e. voice coil 135) for example as excursion of voice coil 135 changes as device 101 moves, and detects the output EMF in the standby state. As such, sensor 850 can comprise one or more of a diode, a voltmeter, an ohmmeter, and the like.

An output of sensor 850 is in communication with an input of amplifier 837 so that the amplifier 837 can control the EMF on load 835 (i.e. voice coil 135) according to the output of sensor 850 ("SENSE-FB"). In other words, sensor 850 and amplifier 837 form a motional feedback loop with load 835 so that amplifier 837 can actively damp voice coil 135.

In other words, in implementations depicted in FIG. 8, device 101 further comprises sensor 850 configured to detect an output EMF from voice coil 135, and circuit 138 is further configured to apply EMF to voice coil 135, the EMF being about similar to the output EMF but in an opposite direction. Hence, as depicted in FIG. 8, circuit 138 comprises components of amplifier 837 that can apply an EMF to load 835 (i.e. voice coil 135), as well sensor 850 and corresponding connections there between. Such implementations can be referred to as "active damping" of voice coil 135.

Put another way, components 840 comprise a combination of a driver amplifier 937 with transducer feed-back using a transducer membrane/voice-coil movement sensor. Driver amplifier 837 terminates a loudspeaker voice coil with low impedance and/or low resistance (as per FIGS. 5 and 6) in an event of sudden acceleration during standby/disable state. Also amplifier 837 can act as a motional feed-back system, with sensor 850, that senses membrane/voice-coil excursion, and responsively controls applied EMF to minimize the excursion.

Furthermore, while implementations depicted in FIG. 8 are described with reference to an audio input, and hence it is assumed that load 835 and/or voice coil 135 is a component of a loudspeaker, similar implementations can be applied to receivers.

Figure 9:
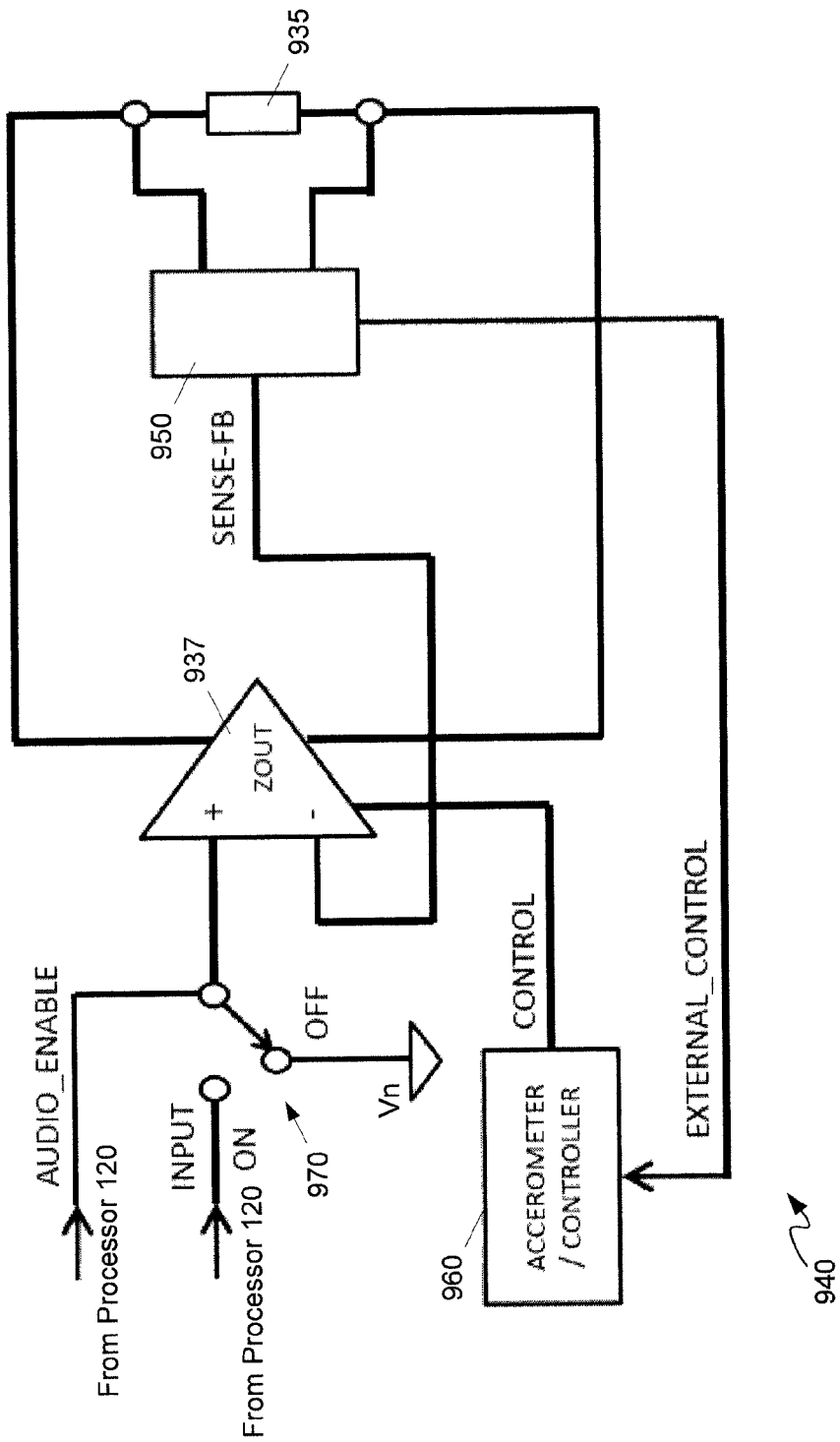
FIG. 9 depicts details of components of the device of FIG. 1 for voice coil protection using damping, according to yet further alterative non-limiting implementations.

Attention is next directed to FIG. 9, which depicts components 940 of combination 140, according to alternative non-limiting implementations. In other words, combination 140 can include components 940, however combination 140 can include other components not depicted in FIG. 9.

Components 940 are substantially similar to components 840, with like elements having like numbers, but preceded by a "9" rather than an "8". For example, components 940 comprise: a load 935 which is representative of voice coil 135; an amplifier 937; and a sensor 950 connected across load 935. While all connections from amplifier 937 to load 935 are not depicted, it is appreciated that connections from amplifier 937 to load 935 are similar to those depicted in FIG. 4, presuming amplifier 937 comprises transistors similar to those depicted in FIG. 4. Further, sensor 950 can be similar to sensor 850 with an output of sensor 950 connected to an input to amplifier 937, as in FIG. 8. Components 940 further comprise a switch 970, similar to switch 870, and connections to a connection Vn to power supply 136, and an audio input from processor 120, with switch being under control of processor 120.

However, in contrast to components 840, components 940 further comprise an accelerometer 960 (which can include a controller), with an input of accelerometer 960 connected to an output of sensor 950, and an output of accelerometer 960 connected to an input of amplifier 937. Accelerometer 960 is generally configured to measure movement and/or an acceleration of device 101, and provides a control signal ("CONTROL") to amplifier 937 indicative of such movement and/or acceleration. When the control signal is above a threshold value and when amplifier 937 is in a standby state, as described above, the EMF is applied to load 935 (i.e. voice coil 135) to restrict movement thereof.

In other words, in these implementations, the EMF is not applied to voice coil 135 unless device 101 is moving and/or accelerating above a threshold value.

Hence, in these implementations, device 101 device of claim 1, further comprising accelerometer 960, and processor 120 is further configured to: when amplifier 937 is in the standby state, and when output from accelerometer 960 is above a threshold value, control circuit 138 to apply EMF to voice coil 135 to restrict excursion thereof.

Put another way, an accelerometer configured to detect a sudden movement of device 101, during a fall for instance, is used to activate voice-coil termination circuitry. This preventative protection can further protect a sound transducer's membrane/voice coil assembly in the event of sudden acceleration.

Furthermore, while implementations depicted in FIG. 9 are described with reference to an audio input, and hence it is assumed that load 935 and/or voice coil 135 is a component of a loudspeaker, similar implementations can be applied to receivers.

Those skilled in the art will appreciate that in some implementations, the functionality of device 101 and/or the speaker circuit of FIG. 64 can be implemented using pre-programmed hardware or firmware elements (e.g., application specific integrated circuits (ASICs), electrically erasable programmable read-only memories (EEPROMs), etc.), or other related components. In other implementations, the functionality of device 101 and/or the speaker circuit of FIG. 64 can be achieved using a computing apparatus that has access to a code memory (not depicted) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, the computer-readable program can be stored as a computer program product comprising a computer usable medium. Further, a persistent storage device can comprise the computer readable program code. The computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof.

A portion of the disclosure of this patent document contains material which is subject to copyright protection. The copyright owner has no objection to the facsimile reproduction by any one of the patent document or patent disclosure, as it appears in the Patent and Trademark Office patent file or records, but otherwise reserves all copyrights whatsoever Persons skilled in the art will appreciate that there are yet more alternative implementations and modifications possible, and that the above examples are only illustrations of one or more implementations. The scope, therefore, is only to be limited by the claims appended hereto.

What is claimed is:

1. A device comprising:
   a processor; a sound transducer comprising a voice coil; a power supply; an amplifier in communication with the voice coil; and a circuit configured to apply an electromotive force ("EMF") to the voice coil under control of the processor; the processor configured to:
   place the amplifier into a standby state; and,
   when the amplifier is in the standby state, control the circuit to apply the EMF to the voice coil using the power supply so that the voice coil has restricted excursion.

2. The device of claim 1, wherein the circuit comprises a portion of the amplifier.

3. The device of claim 1, wherein the circuit comprises electrical components configured to apply the EMF to the voice coil in the standby state.

4. The device of claim 1, wherein the circuit comprises a resistance such that the voice coil is terminated in the resistance, which is in turn in communication with the power supply, when the amplifier is in the standby state, the voice coil being otherwise controlled by the amplifier.

5. The device of claim 1, wherein the circuit comprises two transistors in series with the voice coil and a connection to the power supply located between the two transistors, the processor further configured to turn the two transistors on when the amplifier is in the standby state.

6. The device of claim 5, wherein the amplifier comprises the two transistors, the two transistors used to drive the voice coil to emit sound when the amplifier is not in the standby state.

7. The device of claim 1, further comprising a sensor and one or more switches configured to connect the voice coil with the sensor when the one or more switches are closed, the sensor configured to detect an output from the voice coil, the processor further configured to:
   close the one or more switches when the amplifier is in the standby state, and otherwise open the one or more switches; and,
   when the amplifier is in the standby state, and when the output of the voice coil, as detected by the sensor, is above a threshold value, control the circuit to apply the EMF to the voice coil using the power supply.

8. The device of claim 7, wherein the sensor comprises a diode.

9. The device of claim 1, further comprising a sensor configured to detect an output EMF from the voice coil, the circuit further configured to apply the EMF to the voice coil, the EMF being about similar to the output EMF but in an opposite direction.

10. The device of claim 1, further comprising an accelerometer, the processor further configured to, when the amplifier is in the standby state, and when output from the accelerometer is above a threshold value, control the circuit to apply the EMF to the voice coil.

11. The device of claim 1, wherein the sound transducer comprises a loudspeaker.

12. The device of claim 1, wherein the sound transducer comprises one or more of a receiver and a microphone.

13. The device of claim 1, wherein the processor is further configured to place the amplifier in the standby state by turning off components of the amplifier other than those related to the circuit.

14. A method comprising:
   placing, using a processor of a device, an amplifier of the device into a standby state, the device comprising: the processor; a sound transducer comprising a voice coil; a power supply; the amplifier in communication with the voice coil; and a circuit configured to apply an electromotive force ("EMF") to the voice coil under control of the processor; and,
   when the amplifier is in the standby state, controlling, using the processor, the circuit to apply the EMF to the voice coil using the power supply so that the voice coil has restricted excursion.

15. The method of claim 14, wherein the device further comprises a sensor and one or more switches configured to connect the voice coil with the sensor when the one or more switches are closed, the sensor configured to detect an output from the voice coil, the method further comprising:
   closing, using the processor, the one or more switches when the amplifier is in the standby state, and otherwise opening, using the processor, the one or more switches; and,
   when the amplifier is in the standby state, and when the output of the voice coil, as detected by the sensor, is above a threshold value, control the circuit to apply the EMF to the voice coil using the power supply.

16. The method of claim 14, wherein the device further comprises a sensor configured to detect an output EMF from the voice coil, the method further comprising applying, using the circuit, the EMF to the voice coil, the EMF being about similar to the output EMF but in an opposite direction.

17. The method of claim 14, wherein the device further comprises an accelerometer, the method further comprising, when the amplifier is in the standby state, and when output from the accelerometer is above a threshold value, controlling, using the processor, the circuit to apply the EMF to the voice coil.

18. The method of claim 14, further comprising, placing, using the processor, the amplifier in the standby state by turning off components of the amplifier other than those related to the circuit.

19. A computer program product, comprising a non-transitory computer usable medium having a computer readable program code adapted to be executed to implement a method comprising:
   placing, using a processor of a device, an amplifier of the device into a standby state, the device comprising: the processor; a sound transducer comprising a voice coil; a power supply; the amplifier in communication with the voice coil; and a circuit configured to apply an electromotive force ("EMF") to the voice coil under control of the processor; and, when the amplifier is in the standby state, controlling, using the processor, the circuit to apply the EMF to the voice coil using the power supply so that the voice coil has restricted excursion.

\* \* \* \* \*